United States Patent [19]

Page et al.

[11] 3,893,153

[45] July 1, 1975

[54] LIGHT ACTIVATED THYRISTOR WITH HIGH DI/DT CAPABILITY

[75] Inventors: Derrick J. Page; John S. Roberts, both of Export, Pa.

[73] Assignee: Westinghouse Electric Corp., Pittsburgh, Pa.

[22] Filed: Jan. 10, 1974

[21] Appl. No.: 432,374

[52] U.S. Cl. ........................ 357/38; 357/30; 357/86

[51] Int. Cl. ........................ H01l 9/12

[58] Field of Search... 317/235 N, 235 AB, 235 AE; 357/30, 38, 86

[56] References Cited

UNITED STATES PATENTS

| | | | |
|---|---|---|---|
| 3,577,046 | 5/1971 | Moyson | 317/235 R |
| 3,697,833 | 10/1972 | Nakata | 317/235 R |

*Primary Examiner*—Martin H. Edlow

*Attorney, Agent, or Firm*—C. L. Menzemer

[57] ABSTRACT

A light activated thyristor with high dI/dt capability is provided by disposing first and second thyristors, one a primary and one a pilot thyristor, in a semiconductor body having first and second major surfaces. The two thristors have common cathode-base, anode-base and anode-emitter regions, and have spaced apart cathode-emitter regions adjoining the first major surface of the body. The common cathode-base region adjoins the first major surface between the two thyristors as well as intermittently of the cathode-emitter region of the first thyristor to form shunts. The first major surface at the cathode-emitter region of the second thyristor is adapted for activation of the second thyristor therethrough with electromagnetic radiation of wavelengths corresponding substantially to the energy bandgap of the semiconductor body. The cathode electrode makes ohmic contact with the cathode-emitter region of the first thyristor and the common cathode-base region at the shunts, and the anode electrode makes ohmic contact with the common anode-emitter regions. A floating contact also makes ohmic contact to the cathode-emitter region of the second thyristor and the common cathode-base region between the thyristors, while leaving exposed substantial portions of the first major surface adjoining the cathode-emitter region of the second thyristor.

3 Claims, 3 Drawing Figures

LIGHT ACTIVATED THYRISTOR WITH HIGH DI/DT CAPABILITY

FIELD OF THE INVENTION

The present invention relates to semiconductor devices, and particularly to light activated thyristors.

BACKGROUND OF THE INVENTION

Thyristors are non-linear solid state devices that are bistable. That is, they have both a high impedance and a low impedance state. For this reason, thyristors are generally used as solid state switches. Thyristors commonly have four-layer, PNPN semiconductor structures, with two intermediate regions called cathode-base and anode-base regions and two extremity regions called cathode-emitter and anode-emitter regions. Thyristors are usually gated or switched from a high impedance blocking state to a low impedance conducting state by means of an electrical control signal applied to a base region of the device. Thyristors can also be switched or gated by infrared light radiation incident into at least one base region.

Light activated thyristors are well known for their efficient switching. The incident light generates electron-hole pairs in the vicinity of the reverse biased center PN junction which, instead of recombining, are swept across the junction and increase the anode-to-cathode current. This current increases with increased light, increasing the current gains ($\alpha$'s) of the PNP and NPN transistor equivalents of the structure. If the photocurrent is high enough, it will switch the thyristor from the high impedance, blocking state to the low impedance, conducting state.

A major restriction on light activated thyristors is the dI/dt capability, i.e. the rate of current increase or "turn-on" as a function of time. The difficulty is that only a small portion of the device is responsive to the light activation and initially switches to the conducting state. The device is dependent on carrier diffusion to turn-on the remainder of the active regions, which requires substantial time. Meanwhile, on turn-on, the voltage drops instantaneously to about 10% of the blocking state value. Thus, the current is shunted through the portions or filaments of the device in the conducting state, causing a very high current density and fusion of the device. To avoid such failure of the thyristor, the external circuit typically provides an inductance to limit the current raise on switching of the thyristor, which cause power losses and time lags in the circuit.

The dI/dt capability can be greatly increased by using high intensity laser beams, e.g. Nd lasers, to irradiate the base regions. That is, high intensity light with wavelengths in the infrared penetrates through the cathode-emitter region to generate electron-hole pairs in the sensitive region in and adjacent the space charge region; see U.S. Pat. No. 3,590,344. Very substantial portions of the device are thus switched to the conducting state initially, and such devices have been used to switch high power devices without substantial power dissipation. However, such high intensity lasers are expensive to build and to operate.

The present invention overcomes these difficulties and disadvantages. It provides a light activated thyristor with relatively high dI/dt capability capable of switching with a low intensity light such as that produced by a light emitting diode.

SUMMARY OF THE INVENTION

A light activated thyristor is provided with high dI/dt capability. First and second thyristors are disposed in a semiconductor body having first and second opposed major surfaces. The first thyristor is the primary or load thyristor of the device, and the second thyristor is the pilot or activating thyristor of the device.

Each thyristor has four impurity regions extending through the semiconductor body between the major surfaces. The impurity regions are of alternate carrier-type (i.e. N and P-type) disposed alternately so that PN junctions are formed between adjacent impurity regions. The two intermediate impurity regions in the interior of the body are cathode-base and anode-base regions. And the two extremity impurity regions adjoining the first and second major surfaces, respectively, and adjoining the cathode-base and anode-regions, respectively, are cathode-emitter and anode-emitter regions, respectively.

The cathode-base, anode-base and anode-emitter regions are common to both thyristors. And the cathode-emitter regions of the two thyristors are spaced apart so that the common cathode-base region adjoins the first major surface between the thyristors. The common cathode-base region also adjoins the first major surface intermittently of the cathode-emitter region of the first thyristor to form shunts through said cathode-emitter region.

The portions of the first major surface at least adjoining the cathode-emitter region of the second thyristor are polished or otherwise adapted so that the second thyristor can be activated therethrough by electromagnetic radiation. The activation is performed with electromagnetic radiation of wavelengths corresponding substantially to the energy bandgap of the semiconductor material of the body. For example, for silicon semiconductor material of which thyristors are typically made, where the bandgap energy is 1.1 e.v., the activation light will typically range in wavelengths from about 0.9 to 1.1 microns (i.e. 1.3 to 1.1 e.v.).

To apply the electrical load to the thyristor, cathode and anode electrodes are then disposed on the first and second major surfaces, respectively. The cathode electrode make ohmic contact to the cathode-emitter region of the first thyristor and the common cathode-base region at the shunts through the cathode-emitter region of the first thyristor. And the anode electrode makes ohmic contact to the common anode-emitter region generally over the entire second major surface.

The thyristor also includes a floating contact disposed on the first major surface astride at least portions of the PN junction between the cathode-emitter region of the second thyristor and the common cathode-base region between the thyristors. The floating contact therefore makes ohmic about to both the cathode-emitter region of the second thyristor and the common cathode-base region between the two thyristor structures. Preferably, the floating contact makes contact along the length of said PN junction to provide for more uniform turn-on and higher dI/dt capability.

Preferably, the second thyrister is positioned centrally of the first thyristor. Alternatively, the second thyristor may, however, be positioned peripherally of the first thyristor. In either embodiment, the floating contact is preferably annular or interdigited so that the device is more uniformly turned-on and higher dI/dt capability is attainable.

Other details, objects and advantages of the invention will become apparent as the following description of the presently prefered embodiments and presently preferred ways of operating the same proceeds.

BRIEF DESCRIPTION OF THEE DRAWINGS

In the accompanying drawings, the presently preferred embodiments of the invention and presently preferred operations of the invention are illustrated, in which.

DESCRIPTION OF THE PREFERRED EMBODIMENT

Figure 1:
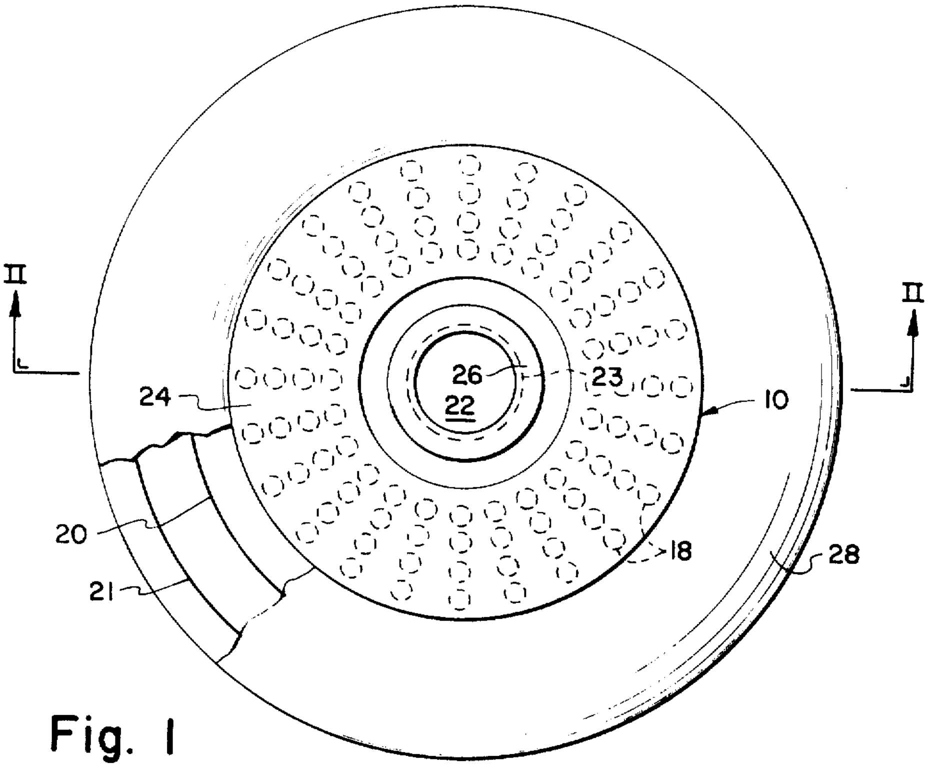
FIG. 1 is a top view of a light activated thyristor in accordance with the present invention.
Figure 2:
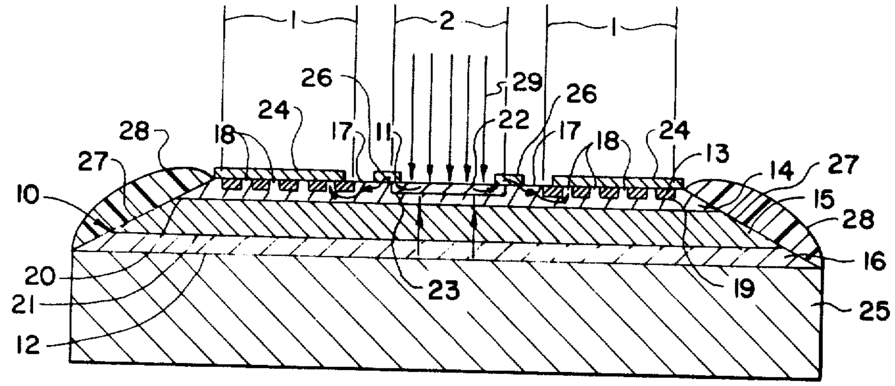
FIG. 2 is a cross-sectional view in elevation of a light activated thyristor taken through line II—II of FIG. 1.

Referring to FIGS. 1 and 2, semiconductor body 10 is provided for forming the thyristor of the present invention therein. Semiconductor body 10 is typically a commercially available single crystal silicon wafer having a thickness typically between 8 and 20 mils, and having first and second opposed major surfaces 11 and 12. The body 10 has disposed therein first thyristor 1 and second thyristor 2 in parallel arrangement, thyristor 1 being the primary or load thyristor and thyristor 2 being the pilot or activating thyristor.

Each thyristor has four impurity regions of alternate carrier-type disposed alternately through semiconductor body 10 between the major surfaces 11 and 12. The first or primary thyristor 1 has a first impurity region of N-type conductivity in body 10 adjoining first major surface 11 to form cathode-emitter region 13, a second impurity region of P-type conductivity adjoining the first impurity region in interior portions of body 10 to form cathode-base region 14, a third impurity region of N-type conductivity adjoining the second impurity region of interior portions of body 10 to form anode-base region 15, and a fourth impurity region adjoining the third impurity region 15 in interior portions of body 10 and adjoining second major surface 12 to form anode-emitter region 16.

Impurity regions 14, 15 and 16 extend through semiconductor body 10 and thus provide common cathode-base, anode-base and anode-emitter regions for second thyristor 2. A fifth impurity region is provided adjoining first major surface 11 speed apart from cathode-emitter region 13 to form cathode-emitter region 22 of second thyristor 2.

Common cathode-base region 14 also adjoins first major surface 11 between cathode-emitter regions 14 and 22 of thyristors 1 and 2, and intermittently of cathode-emitter region 13 of first thyristor 1 to form shunts 18.

The thyrisitor is typically made by commercially obtaining the semiconductor wafer uniformly doped with an N-type impurity, such as phosphorus or arsenic, to a concentration typically between about $5 \times 10^{13}$ and $5 \times 10^{14}$ atoms/cm$^3$. The body is then diffusion doped with a P-type impurity such as boron, gallium or aluminum through both major surfaces by a standard diffusion technique and the diffusion driven by a standard heating technique to a specified depth (e.g. 50 to 75 microns) to form cathode-base and anode-emitter regions 14 and 16, with anode-base region 15 formed therebetween by the residue N-type impurity of the body 10 of a thickness (e.g. 150 to 250 microns) depending on the voltage rating. Cathode-base and anode-emitter regions 14 and 16 have an impurity concentration of typically between about $1 \times 10^{14}$ and $1 \times 10^{17}$ atoms per cm$^3$ in the active portions of the device. If desired, to reduce bulk resistivity, major surface 11 can be masked and the diffusion continued to raise the impurity concentrations of anode-emitter region 16 adjacent major surface 12 to $1 \times 10^{18}$ atoms/cm$^3$ or more.

After the initial diffusion, major surfaces 11 and 12 are masked with a standard diffusion mask such as silicon dioxide. Typically, this masking is accomplished by heating the body 10 in an oxygen-rich atmosphere such as steam at about 1200°–1250°C for 3 to 4 hours. A window pattern suitable for forming cathode-emitter region 13 is then opened in the masking layer by standard photolithographic and etching methods, and cathode-emitter region 13 diffused into body 10 through the window pattern by diffusion of an N-type impurity such as phosphorus by a standard diffusion method. Cathode-emitter region 13 is thus provided with a surface concentration typically of about $1 \times 10^{19}$ to $1 \times 10^{21}$ atoms/cm$^3$ and a depth typically of about 10 to 15 microns.

By the diffusion of cathode-emitter region 13, shunts 18 may be formed intermittently where cathode-base region 14 remains adjoining first major surface 11. Concurrently, intermediate portion 17 of cathode-base region 14 is formed between cathode-emitter region 13 and anode-emitter region 22 where cathode-base region 14 remains adjoining major surface 11. Alternatively or supplementary, shunts 18 may be formed by yet another diffusion of P-type impurity, such as boron or gallium, at a concentration preferably between $1 \times 10^{19}$ and $1 \times 10^{21}$ atoms/cm$^3$ through a suitable diffusion mask.

Second or pilot thyristor 2 also includes cathode-emitter region 22 adjoining major surface 11 spaced apart from cathode-emitter region 13. Cathode-emitter region 22 preferably has a surface impurity concentration between $1 \times 10^{18}$ and $1 \times 10^{21}$ atoms per cm$^3$ of N-type conductivity. Although cathode-emitter region 22 may be separately formed, region 22 is preferably formed simultaneously with cathode-emitter region 13 by opening a second window pattern in the diffusion masking layer.

The basic thyristor structure is thus formed by a double, triple or quadruple diffusion. Each thyristor has four impurity regions extending through body 10 between major surfaces 11 and 12. The impurity regions are of alternate carrier-type disposed alternatively with three PN junctions formed between adjacjent regions of each thyristor: First thyristor 1 has first PN junction 19 between cathode-emitter and cathode-base regions 13 and 14, second PN junction 20 between cathode-base and anode-base regions 14 and 15, and third PN junction 21 between anode-base and anode-emitter regions 15 and 16. Second thyristor 2 has second and third PN junctions 20 and 21 in common with first thyristor 1 concomitantly with the adjacent common impurity regions, and also has a fourth PN junction 23 between cathode-base and cathode-emitter regions 14 and 22.

After the diffusions, major surface 11 may be polished to a mirror finish at least at the portions adjacent cathode-emitter region 22. This polishing is to adapt the portions of surface 11 adjoining cathode-emitter region 22 for light activation of the second thyristor 2 therethrough. The surface may have been previously polished prior to diffusion and no further polishing may be needed. The polishing at this stage will be done, for example, with silica slurry such as Sytan$^{TM}$ made by Monsanto, or with a polishing cloth such as Corfam$^{TM}$ made by DuPont.

To apply an electrical load across the thyristor, cathode and anode electrodes 24 and 25, respectively, are disposed on major surfaces 11 and 12, respectively. Anode electrode 25 of typically molybdenum or tungsten (possibly gold-plated to reduce oxidation) is applied to major surface 12. The electrode is usually separately formed in a circular shape at least as large as semiconductor body 10 and alloyed to major surface 12 by heating the assembly to make ohmic contact to anode-emitter region 16 across the entire major surface.

Electrode 24 of a suitable metal such as aluminum is preferably formed by vapor or sputter deposition over major surface 11. The metal layer is subsequently removed from the major surface everywhere but where it is desired by photolithographically masking with a negative photoresist and subsequent etching with a suitable etchant such as 10% sodium hydroxide solution. Electrode 24 thus makes ohmic contact to cathode-emitter region 13 and the shunts 18 of cathode-base region 14 intermittently of region 13.

To complete the thyristor assembly, floating contact 26 is also positioned on the first major surface 11 astride at least portions of the first PN junction 19. Floating contact 26 thus makes ohmic contact with both common cathode-base region 14 between thyrisitors 1 and 2 and cathode-emitter region 22 of second thyristor 2, while leaving exposed substantial portions of first major surface 11 adjoining cathode-emitter region 22. Preferably,floating contact 26 is formed simultaneously with first metal contact 24 by the same metalization, masking and etching steps. Subsequently, side surfaces 27 are preferably beveled to shape the electric fields for high voltage blocking, and passivating coating 28 such as an epoxy or silicons resin is applied thereover to protect the body from atmospheric effects.

In operation, an external load potential is applied to the cathode and anode electrodes 24 and 25 which reverse biases second PN junction 20 between the base regions and establishing the thyristor in a forward blocking state. By virtue of shunts 18 and floating contact 26, cathode-emitter region 22 is at the same potential as cathode-emitter region 13 and second or pilot thyristor 2 is also in a forward blocking state.

To switch the device, portions of major surface 11 adjoining cathode-emitter region 22 are illuminated with certain electromagnetic radiation as shown by arrows 29 in FIG. 2. The radiation has a wavelength corresponding substantially to the bandgap energy of the semiconductor material composing body 10. The radiation can thus penetrate through cathode-emitter region 22 into cathode-base region 14 and possibly anode-base region 15. Electron-hole pairs are thus generated in and adjacent the space-charge region which are swept across reverse biased PN junction 20 to increase the anode-to-cathode current flow within the thyristor 2.

When the illumination is sufficient, pilot thyristor 2 will switch to a low impedance state and a current increased by the amplifying gains of the structure will flow from anode electrode 25 through thyristor 2 to floating contact 26, and through floating contact 26 and into cathode-base region 14. In cathode-base region 14, the current flows along the surface 11, which is the lowest resistivity portion to cathode-emitter region 13. Then the current will flow downward and then laterally through cathode-base region 14 adjacent cathode-emitter region 13 to the first series of shunts 18. This current flow is shown by arrows in FIG. 2.

The lateral current flow through cathode-base region 14 adjacent cathode-emitter region 13 forward biases first PN junction 19 and causes cathode-emitter region 13 to inject carriers into and through the base regions 14 and 15. Because of the amount of lateral current flow — due to the anode current through thyrister 2 — the whole inner periphery of thyristor 1 is fired initially. Thus, the dI/dt capability of the device is high, and can be extended by extending the length of intermediate portion 17 of cathode-base region 14 between cathode-emitter region 13 and cathode-emitter region 22. The dI/dt capability can therefore be further extended by adapting the present invention to known interdigital cathode designs.

It should also be noted for highest dI/dt capability that illumination should always be done entirely through the cathodes-emitter region 22 of thyristor 2 as shown in FIG. 2. The photo-introduced current will in this way build-up to a relatively high level before firing, and a substantial portion of thyristor 2 will be switched to the conduction state on the initial firing. It may be appropriate, however, in some embodiments that cathode-emitter region 22 be annular instead of circular as shown in FIG. 2. That is, the cross-section of cathode-emitter region 22 does not extend through the center of the device, but rather is in two cross-sectional islands spaced apart from each other adjacent floating contact 26. The important thing, however, is that the electron-hole generation should occur in the four-layer structure so that the gain, i.e. amplification, can be obtained to fire the primary thyristor.

Alternatively, cathode-emitter region 22 may preferably be reduced in thickness by, for example, polishing and/or etching. The reduction in thickness permits the thyristor to be fired with lower intensity light because the amount of light absorption by region 22 is reduced.

Figure 3:
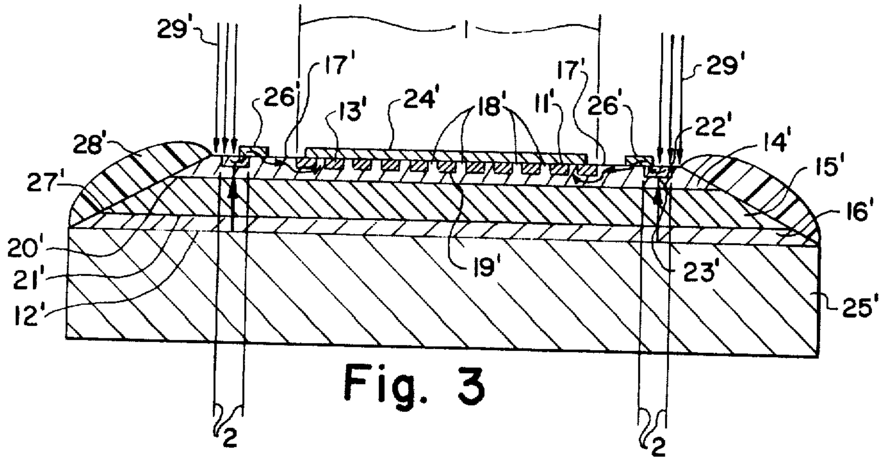
FIG. 3 is a cross-sectional view in elevation of an alternate light activated thyristor in accordance with the present invention.

The light used to turn-on the device can in general be of relatively low intensity. Various light-emitting diodes commercially available are suitable. The exact wattage and pulse duration of the light source will of course vary with the electrical characteristics of the primary and pilot thyristors and the number of thyristors illuminated at one time. Generally, it can be said that a light-emitting diode providing 0.96 $\mu$m light of 100 milliwatts in a pulse of 1 microsecond duration has been found sufficient to fire an embodiment of the present invention Referring to FIG. 3, an alternate embodiment of the invention is shown. All parts are the same as described in connection with FIGS. 1 and 2 except that the cathode-emitter region 22' is peripheral of the cathode emitter region 13', instead of central thereof. This alternative thyristor of the present invention can be light activated by the same mechanism as described in connection with FIGS. 1 and 2.

While the presently preferred embodiments of the invention and method for performing them have been specifically described, it is distinctly understood that the invention may be otherwise variously embodied and used within the scope of the following claims.

What is claimed is:

1. A light activated thyristor with high dI/dt capability comprising:

A. first and second thyristors disposed in a semiconductor body having first and second major surfaces; each thyristor having four impurity regions extending through the body between the major surfaces; said impurity regions of alternate carrier-type disposed alternately with the PN junctions formed between adjacent regions; the two regions interior being cathode-base and anode-base regions, and the two regions adjoining the first and second major surfaces and adjoining the cathode-base and anode-base regions,respectively, being cathode-emitter and anode-emitter regions, respectively;

B. the cathode-base, anode-base and anode-emitter regions of the first and second thyristors being common to both thyristors;

C. said common cathode base region adjoining the first major surface intermittently of the cathode-emitter region of the first thyristor to form shunts, and between the cathode-emitter regions of the first and second thyristor such that the cathode-emitter regions are spaced apart;

D. portions of the first surface adjoining the cathode-emitter region of the second thyristor adapted for activation of the second thyristor therethrough by electromagnetic radiation of wavelengths corresponding substantially to the bandgap energy of the semiconductor material of the body;

E. cathode and anode electrodes disposed on first and second major surfaces, respectively, of the semiconductor body and making ohmically contact with the cathode-emitter region of the first thyristor and the common anode-emitter region of both thyristors, respectively, said cathode electrode also making ohmic contact with the cathode-base region at the shunts through the cathode-emitter region of the first thyristor; and F. a floating contact positioned on the first major surface to make ohmic contact with the common cathode-base region between the thyristors and the cathode-emitter region of the second thyristor, while leaving exposed for light activation therethrough substantial portions of the first major surface adjoining the cathode-emitter region of the second thyristor.

2. A light activated thyristor with high dI/dt capability as set forth in claim 1 wherein:

the second thyristor is positioned centrally of the first thyristor, and the floating contact is annular in shape.

3. A light activated thyristor with high dI/dt caability as set forth in claim 1 wherein:

the second thyristor is positioned peripherally of the first thyristor and the floating contact is annular in shape.

* * * * *